(12) United States Patent
Komai et al.

(10) Patent No.: US 6,603,382 B1
(45) Date of Patent: Aug. 5, 2003

(54) INDUCTIVE ELEMENT HAVING IMPROVED SUPERPOSED DC CURRENT CHARACTERISTIC

(75) Inventors: Eiichi Komai, Niigata-ken (JP); Yoshito Sasaki, Niigata-ken (JP); Kazushi Ogawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/547,639

(22) Filed: Apr. 12, 2000

(30) Foreign Application Priority Data

Apr. 13, 1999 (JP) .......................... 11-104842
Mar. 7, 2000 (JP) ...................... 2000-061778

(51) Int. Cl.$^7$ ............................................. H01F 5/00
(52) U.S. Cl. .................. 336/200; 336/83; 336/212; 336/218
(58) Field of Search ................. 336/200, 212, 336/218, 83

(56) References Cited

U.S. PATENT DOCUMENTS 5,583,474 A * 12/1996 Mizoguchi et al. ........... 336/83

FOREIGN PATENT DOCUMENTS

JP  8-273934  * 10/1996

* cited by examiner

*Primary Examiner*—Elvin Enad
*Assistant Examiner*—Jennifer A. Poker
(74) *Attorney, Agent, or Firm*—Brinks Hofer Gilson & Lione (57) ABSTRACT

A coil layer, and a magnetic layer covering the coil layer via an insulating layer are provided. The magnetic layer comprises at least two magnetic films in lamination. There is adopted an inductive element including a combination of magnetic films in which, for any two magnetic films forming the magnetic layer, the value of product of multiplication of magnetic permeability and thickness of a magnetic film close to the coil layer is smaller than the value of product of multiplication of magnetic permeability and thickness of a magnetic film distant from the coil layer. This inductive element permits improvement of the superposed DC current characteristic and prevention of a decrease in inductance because magnetic fluxes generated from the coil layer are induced to a magnetic film distant from the coil layer.

16 Claims, 7 Drawing Sheets

INDUCTIVE ELEMENT HAVING IMPROVED SUPERPOSED DC CURRENT CHARACTERISTIC

BACKGROUND OF THE INVENTION

1. Field of the Invention

The present invention relates to an inductive element such as a thin-film inductor or a thin-film transformer. More particularly, the invention relates to an inductive element which has a magnetic layer formed of a plurality of magnetic films in lamination, can avoid concentration of magnetic fluxes from a coil layer to the magnetic film the closest to the coil layer, or more preferably, can improve high frequency characteristic by ensuring formation of a uniform magnetic flux distribution for all the magnetic layers.

2. Description of the Related Art

For example, a thin-film inductor comprises a first magnetic layer formed on a substrate, a coil layer formed via an insulating layer on the first magnetic layer, and a second magnetic layer formed via another insulating layer on the coil layer.

The above-mentioned thin-film inductor, which is used, for example, in a micro DC-DC converter, has a problem in that, when the magnetic layers composing the thin-film inductor are formed by single layers having a large thickness, eddy-current loss increases in a high frequency band, thus making it impossible to obtain a satisfactory high frequency characteristic.

Figure 10:
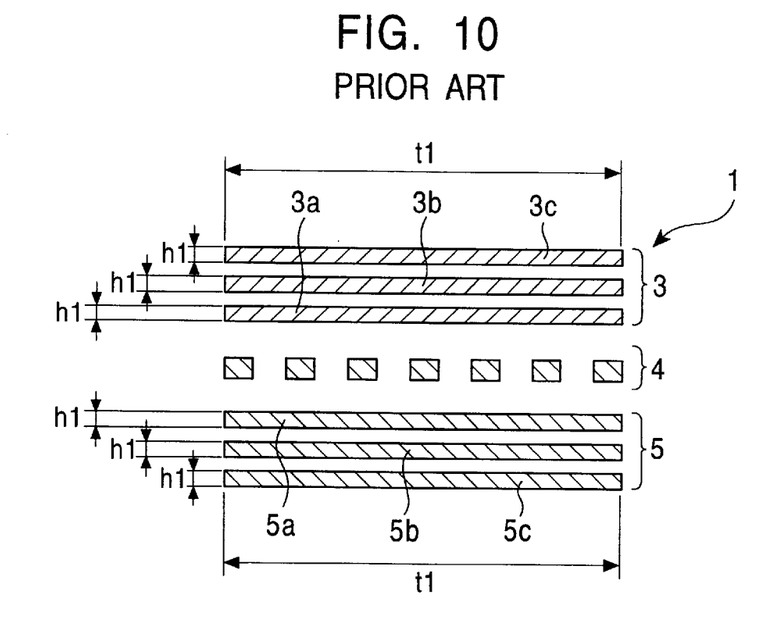
FIG. 10 is a partial sectional view illustrating the structure of a conventional thin-film inductor (inductive element) and FIG. 11 is a graph illustrating the relationship between frequency an equivalent resistance of each magnetic film in the thin-film inductor shown in FIG. 10.

In a conventional art, therefore, a thin-film inductor 1 comprising magnetic layers 3 and 5 formed into a multi-layer structure was devised as shown in FIG. 10. This permits maintenance of inductance at above a certain level and reduction of eddy-current loss, thus improving high frequency characteristic.

As shown in FIG. 10, a coil layer 4 is provided between a first magnetic layer 5 and a second magnetic layer 3, and each of the magnetic layer 5 and 3 comprises a plurality of magnetic films 5a to 5c or 3a to 3c in lamination.

Also as shown in FIG. 10, all the magnetic films composing the magnetic layers 5 and 3 are formed with the same width t1, the same thickness h1 and the same magnetic permeability $\mu 1$.

However, if all the magnetic films forming the magnetic layers 5 and 3 are formed with the same width t1, the same thickness h1 and the same magnetic permeability t1, a magnetic film closer to the coil layer 4 would have concentration of magnetic fluxes from the coil layer 4. This prevents formation of a uniform magnetic flux density distribution throughout the entire magnetic films, thus making it impossible to cause all the magnetic films to perform the same functions.

Because all the magnetic films forming the magnetic layer 4 are formed into the same thickness h1, the magnetic films 5a and 3a the closest to the coil layer 4 have an increased magnetic flux density within the magnetic films caused by fluxes generated from the coil layer 4, thus making it easier to reach the magnetic saturation state. When the magnetic films 5a and 3a become magnetization-saturated, the magnetic films 5a and 3a no more substantially function as magnetic films but are in a state similar to air-core state.

More specifically, it was the conventional practice to reduce eddy-current loss by forming the magnetic layer through lamination of thin magnetic films. However, if all the magnetic films are formed with the same thickness h1 and the same magnetic permeability $\mu 1$, magnetic fluxes from the coil layer 4 are concentrated more on a magnetic film closer to the coil layer 4, and the magnetic film approaches the saturated state more along with the increase in amplitude of excitation current or in superposed DC current, thus posing problems such as a decrease in inductance.

Magnetic fluxes from the coil layer 4 concentrate more on a magnetic film closer to the coil layer 4, thus preventing obtaining a uniform magnetic flux distribution for the individual magnet films. This is proved also from equivalent resistance of the individual magnetic films as described below.

Figure 11:
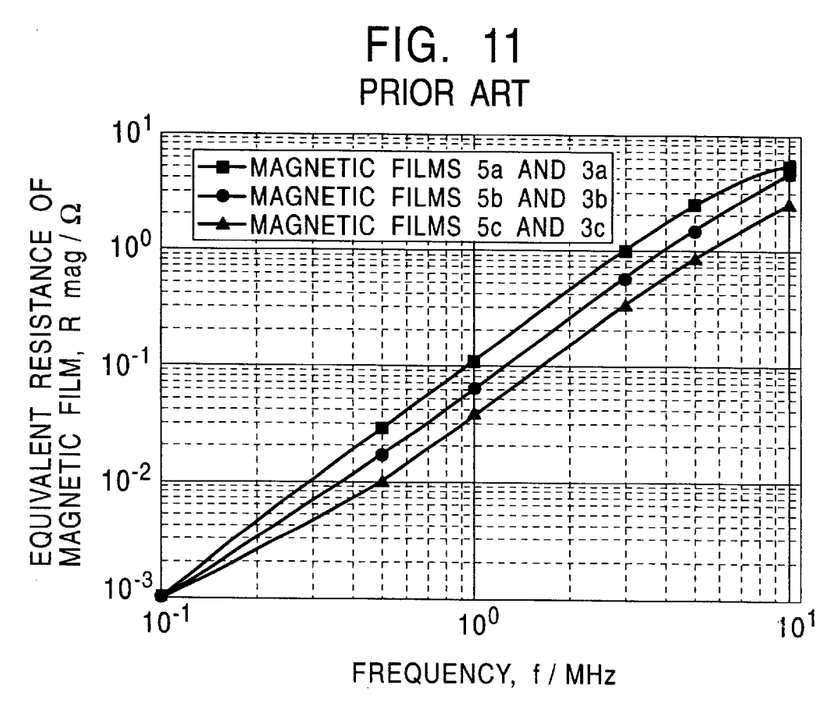

FIG. 11 is a graph illustrating the relationship between frequency and equivalent resistance of the individual magnetic films. In all frequency bands, as shown in FIG. 11, equivalent resistance is the largest in the magnetic films 5a and 3a the closest to the coil layer 4, followed by equivalent resistance of the magnetic films 5b and 3b, and equivalent resistance is smaller in the magnetic films 5c and 3c the most distant from the coil layer 4.

The differences in equivalent resistance as described above between the magnetic films are attributable to different amounts of magnetic flux induced from the coil layer 4 to the magnetic films. More magnetic fluxes generated from the coil layer 4 are induced into the magnetic film closer to the coil layer 4. A magnetic film closer to the coil layer 4 would have therefore a larger equivalent resistance.

As described above, when the magnetic films 5a and 3a the closest to the coil layer 4 reach the magnetically saturated state, the function to be performed by the magnetic films 5 and 3 is accomplished by only the magnetic films 5b, 3b, 5c and 3c, and this results in substantially decrease in the thickness of the magnetic films 5 and 3. This in turn leads to a decrease in inductance and a deterioration of superposed DC current characteristic.

When the magnetic films 5a and 3a reach the magnetically saturated state, fluxes generated from the coil layer 4 are concentrated on the magnetic films 5b and 3b which are closer to the coil layer 4 next to the magnetic films 5a and 3a, and the magnetic films 5b and 3b become susceptible to magnetic saturation as in the case of the magnetic films 5a and 3a, and this forms another factor causing a deterioration of superposed DC current characteristic.

SUMMARY OF THE INVENTION

The present invention was developed to solve these problems and has an object to provide an inductive element which has a magnetic layer formed of a plurality of magnetic films in lamination, can avoid concentration of magnetic fluxes from a coil layer to the magnetic film the closest to the coil layer, or more preferably, can improve high frequency characteristic by ensuring formation of a uniform magnetic flux distribution for all the magnetic layers.

A first aspect of the invention provides an inductive element comprising a coil layer, and a magnetic layer covering the coil layer via an insulating layer; the magnetic layer being formed of at least two superposed magnetic layers; and inductive element including a combination of magnetic films in which, for any two magnetic films forming the magnetic layer, the value of product of multiplication of magnetic permeability and thickness of a magnetic film closer to the coil layer is smaller than the value of product of multiplication of magnetic permeability and thickness of a magnetic film more distance from the coil layer.

When forming a magnetic layer into a multi-layer configuration, it is the conventional practice to form a plurality of magnetic films with the same magnetic permeability and the same thickness. As a result, fluxes from the coil layer are concentrated more on a magnetic film closer to the coil layer, thus preventing formation of a uniform magnetic flux distribution for all magnetic films, and the individual magnetic films cannot equally display their functions. Particularly, the magnetic film the closest to the coil layer becoming in magnetically saturated state and cannot substantially function as a magnetic layer, leading to decreased superposed DC current characteristic and inductance. The present circumstances are therefore that the effect of using a multi-layer magnetic layer is not sufficiently displayed.

In the first aspect of the invention, in contrast, concentration of magnetic fluxes on a magnetic film close to the coil layer can be avoided by using, for any two magnetic films forming the magnetic layer, a value of product of multiplication of magnetic permeability and thickness of a magnetic film closer to the coil layer smaller than the value of product of multiplication of magnetic permeability and thickness of a magnetic film more distant from the coil layer.

When the magnetic layer has at least three superposed magnetic films, in order to avoid concentration of magnetic fluxes from the coil layer on a magnetic film close to the coil layer and to make fluxes easily inducible to a magnetic film more distant from the coil layer, it is preferable that the value of product of multiplication of magnetic permeability and thickness of the magnetic film the closest to the coil layer is smaller than the value of product of multiplication of magnetic permeability and thickness of the other magnetic films. It is more preferable that the value of product of multiplication of magnetic permeability and thickness of the magnetic film the most distant from the coil layer is larger than the value of product of multiplication of magnetic permeability and thickness of the other magnetic films. Further, it is the most desirable that the value of product of multiplication of magnetic permeability and thickness of the magnetic films is sequentially larger according as the distance from the coil layer becomes longer.

More specifically, in the first aspect of the invention, it is possible to avoid concentration of magnetic fluxes from the coil layer to the magnetic film the closest to the coil layer, increase the amount of fluxes induced to the magnetic film more distant from the coil layer, and induce an amount of fluxes meeting the individual magnetic films from the coil layer. It is hence possible to bring the magnetic flux density distribution of each magnetic film closer to the uniform state, thus ensuring substantially equal functioning of all the magnetic films. Further, by appropriately adjusting the value of product of multiplication of magnetic permeability and thickness of each magnetic film, it is possible to reduce the total sum of values of equivalent resistance of the individual magnetic films, improve superposed DC current characteristic as compared with the conventional art, and prevent inductance from decreasing. It is also possible to reduce iron loss, and particularly, to reduce iron loss in the high frequency region.

The first aspect of the invention utilizes the fact that a difference in thickness between the magnetic films forming the magnetic layer leads to different values of product of multiplication of magnetic permeability and thickness. If the individual magnetic films are identical in magnetic permeability, it is possible to produce a difference in the value of product of multiplication of magnetic permeability and thickness by using different thicknesses for the individual magnetic films. The first aspect of the invention is based also on the fact that a difference in magnetic permeability between the magnetic films forming the magnetic layer leads to different values of product of multiplication of magnetic permeability and thickness. If all the magnetic films have the same thickness, it would be possible to produce differences in the value of product of multiplication of magnetic permeability and thickness by using different values of magnetic permeability for the individual magnetic films. By appropriately adjusting thicknesses and selecting magnetic materials, therefore, it is possible to obtain more uniform magnetic flux distributions for the individual magnetic films, and ensure substantially equal functioning of all the magnetic films.

A second aspect of the invention provides an inductive element comprising a coil layer, and a magnetic layer covering the coil layer via an insulating layer, wherein the magnetic layer is formed of at least two superposed magnetic films, and of any two magnetic films from among those forming the magnetic layer, the magnetic layer includes a combination in which the magnetic film closer to the coil layer has a thickness smaller than the thickness of the magnetic film more distant from the coil layer.

When the magnetic layer has at least three superposed magnetic films, the thickness of the magnetic film the closest to the coil layer should preferably be smaller than the thickness of the other magnetic films, and the magnetic film the most distant from the coil layer should preferably be larger than the thickness of the other magnetic films. More preferably, the thickness of the magnetic films should be gradually larger according as the film becomes more distant from the coil layer.

A third aspect of the invention provides an inductive element comprising a coil layer and a magnetic layer covering the coil layer via an insulating layer; the magnetic layer having at least two superposed magnetic films, including a combination of magnetic films in which magnetic permeability of a magnetic material forming the magnetic film close to the coil layer is smaller than magnetic permeability of a magnetic material forming the magnetic film distant from the coil layer, for any two magnetic films forming the magnetic layer.

When the magnetic layer has at least three superposed magnetic films, magnetic permeability of a magnetic material forming the magnetic film the closest to the coil layer should preferably be smaller than magnetic permeability of a magnetic material forming the other magnetic films, and magnetic permeability of a magnetic material forming the magnetic film the most distant from the coil layer should preferably be larger than magnetic permeability of a magnetic material forming the other magnetic films. More preferably, magnetic permeability of the magnetic material forming the magnetic films should be sequentially larger according as the magnetic film is more distant from the coil layer.

In the aforementioned aspect of the invention, the magnetic film the closest to the coil layer from among the magnetic films forming the magnetic layer should preferably have both side ends located on the center side more than the both side ends of at least one of the other magnetic films, and the magnetic film the most distant from the coil layer from among the magnetic films forming the magnetic layer should preferably have both side ends extending sideways more than both side ends of at least one of the other magnetic films. It is the most desirable that, for any two magnetic films from among the magnetic films forming the magnetic layer, a magnetic film more distant from the coil layer has a larger width so that the both side ends of a magnetic film more distant from the coil layer extend sideways more than the both side ends of a magnetic film closer to the coil layer.

As a result, it is possible to more appropriately avoid concentration of magnetic fluxes from the coil layer to the magnetic film the closest to the coil layer, and further, makes it easier for magnetic fluxes from the coil layer more inducible according as the magnetic film becomes more distant from the coil layer, thus permitting achievement of a more uniform magnetic flux distribution for the individual magnetic films and makes it possible to cause all the magnetic films to appropriately function.

In the aforementioned aspect of the invention, from among the magnetic films forming the magnetic layer, a slit or a notched portion should preferably be formed in at least one magnetic film except for the magnetic film the most distant from the coil layer. The most distant magnetic film plays the role of a shield, and by forming a slit or a notched portion in at least one magnetic film except for the magnetic film the most distant from the coil layer, it is possible to prevent magnetic fluxes from concentrating on the magnetic layer the closest to the coil layer, achieve a uniform magnetic flux density distribution in each of the magnetic films, and reduce equivalent resistance. It is therefore possible, in an inductive element, to reduce the total sum of values of equivalent resistance of all the magnetic films, improve superposed DC current characteristic, and ensure an inductance equal or superior to the conventional one.

BRIEF DESCRIPTION OF THE DRAWINGS

FIG. 2 is a partial sectional view illustrating the structure of the thin-film inductor of FIG. 1 cut along the line II—II in the direction a;

DESCRIPTION OF THE PREFERRED EMBODIMENTS

Figure 1:
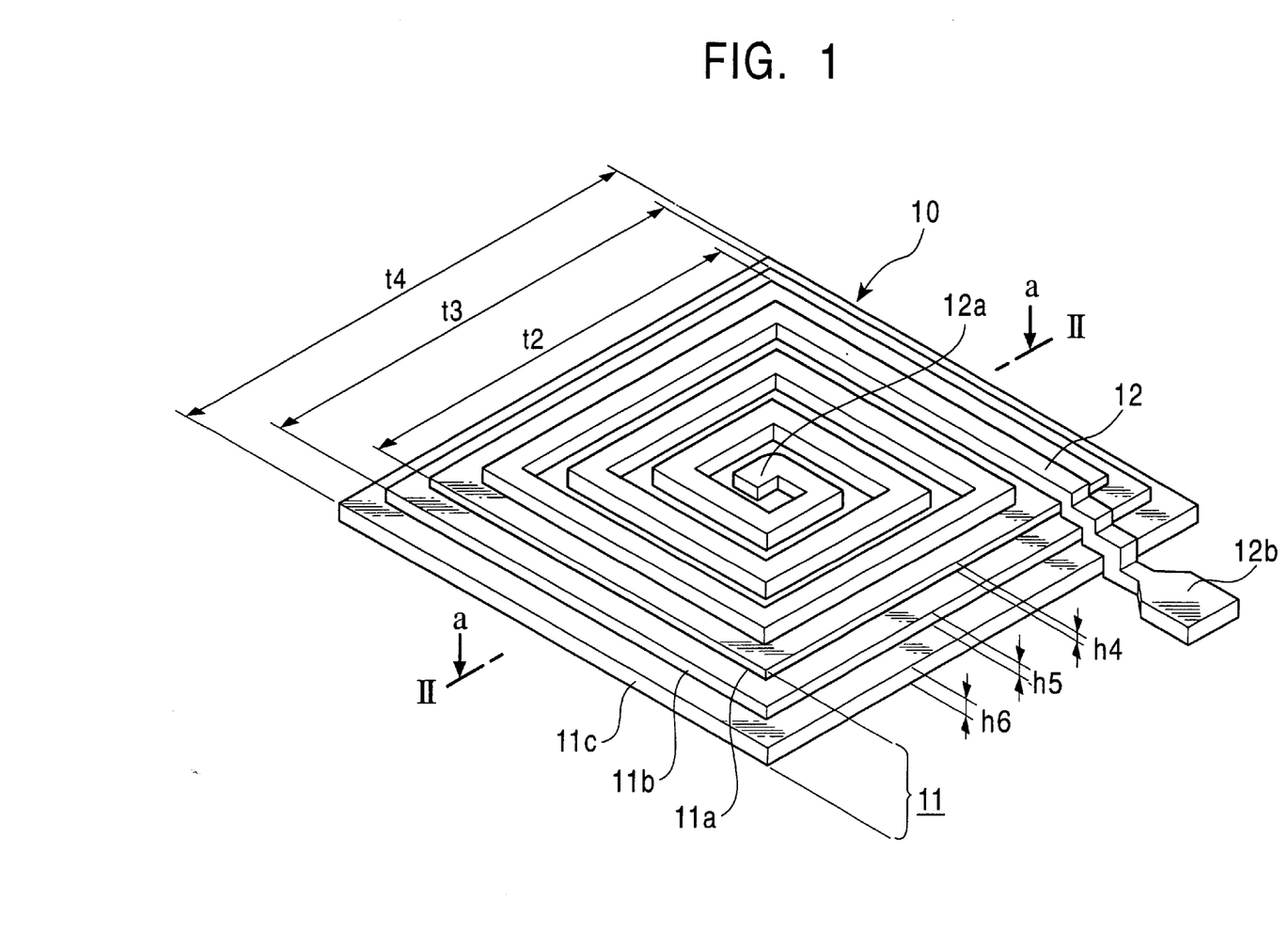
FIG. 1 is a partial perspective view illustrating the structure of a thin-film inductor (inductive element) of the present invention.
Figure 2:
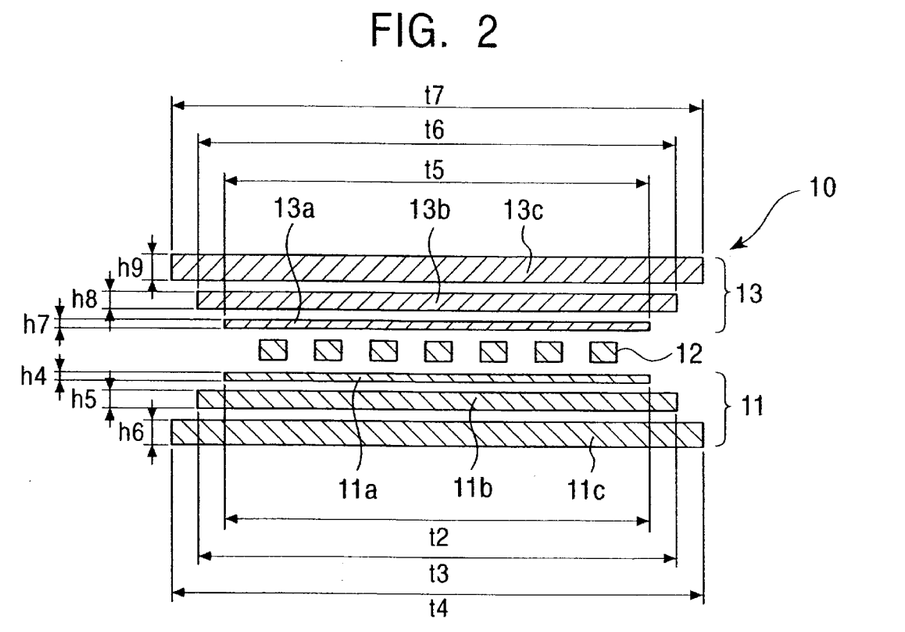

FIG. 1 is a partial perspective view illustrating the structure of a thin-film inductor (inductive element) in a first embodiment of the present invention; and FIG. 2 is a partial sectional view illustrating the structure of the thin-film inductor shown in FIG. 1 cut along the line II—II in the direction a.

As shown in FIG. 2, a thin-film inductor 10 comprises a first magnetic layer 11 on a substrate; a coil layer 12 formed on the first magnetic layer 11 via an insulating layer (not shown) formed from an insulating material such as $SiO_2$; and a second magnetic layer 13 formed on the coil layer 12 via an insulating layer (not shown). In FIG. 1, the second magnetic layer 13 formed on the coil layer 12 via the insulating layer is omitted from the drawing.

As shown in FIGS. 1 and 2, the first magnetic layer 11 is formed by laminating a plurality of magnetic films 11a to 11c via an insulating film (not shown).

As shown in FIG. 1, the coil layer 12 formed on the first magnetic layer 11 is formed in a flat spiral, and the coil layer 12 is pattern-formed from a conductive material having a low electric resistance such as copper. The invention is thus applicable to a planar magnetic element using a planer coil.

As shown in FIG. 1, the winding center 12a of the coil layer 12 is electrically connected to an outgoing electrode (not shown) communicating to outside via a throughhole (not shown) pierced at the center of, for example, the first magnetic layer 11. The outer winding end 12b of the coil layer 12 shown in FIG. 1 is also electrically connected to another outgoing electrode.

The second magnetic layer 13 formed on the coil layer 12 via the insulating layer is formed, as shown in FIG. 2, by laminating a plurality of magnetic films 13a to 13c via the insulating layer (not shown).

In the embodiments of the invention, as described above, the first magnetic layer 11 and the second magnetic layer 13 are formed by laminating the plurality of magnetic films 11a to 11c and 13a to 13c, and as a result, it is possible to reduce an eddy-current loss as compared with a magnetic layer comprising a single layer.

In the embodiments of the invention, as shown in FIGS. 1 and 2, the thickness of a magnetic film is larger according as the magnetic film is more distant from the coil layer 12. As shown in FIGS. 1 and 2, from among the magnetic films forming the first magnetic layer, the magnetic film 11a formed at the closest position to the coil layer 12 is formed with a thickness h4, and the magnetic film 11c formed at the most distant position from the coil layer 12 is formed with a thickness h6. The magnetic film 11b formed between the magnetic films 11a and 11c is formed with a thickness h5. The thicknesses h4, h5 and h6 are larger according as the distance from the coil layer is larger.

Also for the second magnetic layer 13, as shown in FIG. 2, the thickness h7 to h9 of the magnetic films 13a to 13c are larger in the order of the thicknesses h7, h8 and then h9, suggesting that the thickness is larger according as the distance from the coil layer 12 is longer.

In the invention, as described above, a magnetic film has a larger thickness according as it is more distant from the coil layer 12. With this configuration, magnetic fluxes generated from the coil layer 12 is induced more easily to the magnetic film distant from the coil layer 12. It is possible to appropriately disperse magnetic fluxes which have conventionally concentrated only on the magnetic films 11a and 13a the closest to the coil layer 12 to all the magnetic films.

A magnetic film more distant from the coil layer 12 has a larger value of product of multiplication of magnetic permeability and thickness.

In the embodiments of the invention, as described above, the thickness of a magnetic film is larger according as the distance from the coil layer 12 is longer. In this structure, more magnetic fluxes generated from the coil layer 12 are induced to the magnetic film more distant from the coil layer 12. It is therefore possible to appropriately disperse magnetic fluxes to all the magnetic films, which have conventionally concentrated only on the magnetic films 11a and 13a the closes to the coil layer 12.

In the embodiments of the invention, as described above, a large amount of magnetic fluxes is induced by providing a larger thickness according as a magnetic film is more distant from the coil layer, i.e., by reducing magnetic resistance in the magnetic circuit according as the distance from the coil layer 12 is larger. As a result, the magnetic flux density approaches the uniform state among all the magnetic films, and it is thus possible to avoid saturation of only the magnetic films 11a and 13a close to the coil layer 12.

More specifically, each of the magnetic films can effectively induce an amount of magnetic flux meeting the thickness thereof from the coil layer 12, thus ensuring formation of substantially a uniform magnetic flux distribution for the individual magnetic films. The thickness of a magnetic film should preferably be within a range of from 0.5 to 15 μm. A thickness of a magnetic film of over 15 μm makes it difficult to expect an increase in inductance.

In the embodiment shown in FIGS. 1 and 2, there is observed that a magnetic film has a larger width according as the distance from the coil layer becomes longer.

In the embodiments of the invention, as shown in FIGS. 1 and 2, from among the magnetic films forming the first magnetic layer 11, the magnetic film 11a the closest to the coil layer 12 has the smallest width t2, and the magnetic film 11c the most distant from the coil layer 12 has the largest width t4. The width t3 of the magnetic film 11b located between the magnetic films 11a and 11c is larger than the width t2 of the magnetic film 11a and smaller than the width t4 of the magnetic film 11c.

Similarly, from among the magnetic films forming the second magnetic layer 13, the magnetic film 13a the closest to the coil layer 12 has the smallest width t5, and the magnetic film 11c the most distant from the coil layer 12 has the largest width t7. The width t6 of the magnetic film 13b located between the magnetic films 13a and 13c larger than the width t5 of the magnetic film 13a and smaller than the width t7 of the magnetic film 13c.

Because a magnetic film more distant from the coil layer 12 is formed to have a larger width, the both side ends of the magnetic films 11b and 13b located in the middle extend sideways as compared with the both side ends of the magnetic films 11a and 13a, and the both side ends of the magnetic films 11c and 13c formed at positions the most distant from the coil layer 12 extend sideways as compared with the both side ends of the magnetic films 11b and 13b located in the middle.

Since the both side ends of a magnetic film more distant from the coil layer 12 extend sideways more, magnetic fluxes generated from the coil layer 12 are more easily inducible to a magnetic film more distant from the coil layer 12, permitting effective achievement of a uniform magnetic flux density for all the magnetic films.

The value of width formed by the extension of the both side ends of a magnetic film sideways as compared with the both side ends of a magnetic film closer to the coil layer 12 is called the amount of overhang. It is possible to promote achievement of a uniform magnetic flux distribution for all the magnetic films by appropriately adjusting the amount of overhang in the invention.

In the embodiments of the invention, the magnetic films forming the magnetic layers 11 and 13 may be formed from the same material or different materials. From the point of view of improving high frequency characteristic, however, a high relative resistance is pointed out as a property required to have for a magnetic material, and all the magnetic films should preferably be made of a magnetic material having a high relative resistance.

The magnetic films 11a to 11c and 13a to 13c forming the magnetic layers 11 and 13 are soft magnetic films excellent in high frequency characteristic, which is, for example, an F—M—O-based soft magnetic material (where, M represents one or more elements selected from the group consisting of Zr, Hf, V, Nb, Ta, Mo, W, Al, Si, Cr, P, C, B, Ga, Ge and rare-earth elements) as disclosed in the U.S. Pat. No. 5,573,863, a Co—Fe—E—O-based soft magnetic material (where, element E represents one or more elements selected from the group consisting of Ti, Zr, Hf, Ta, Mo, W, Al, Si, Cr, P, C, B, Ga, Ge and rare-earth elements) as disclosed in the U.S. Pat. No. 5,833,770, Co—Ta—Hf, Co—Ta—Hf—Pd, Co—Zr—Nb, Co—Zr—Ta or Co—Hf—Nb.

Further, in the embodiments of the invention, a magnetic film more distant from the coil layer 12 should preferably be formed of a magnetic material having a higher magnetic permeability with a view to effectively achieving a uniform magnetic flux distribution for all magnetic films. The individual magnetic films can have different values of magnetic permeability, not only by forming the magnetic films from appropriately selected magnetic materials having different chemical compositions comprising different values of magnetic permeability, but also, even when all the magnetic films are made of a magnetic material having the same chemical composition, by changing the composition ratios of the constituent elements of the magnetic material.

By forming a magnetic film more distant from the coil layer 12 from a magnetic material having a higher magnetic permeability, as described above, it is possible to make the magnetic film more distant from the coil layer 12 capable of more easily inducing magnetic flux, thereby promoting achievement of a uniform magnetic flux distribution for all the magnetic films.

In the embodiments of the invention, as described above, by forming a magnetic film more distant from the coil layer 12 with a larger thickness, fluxes from the coil layer 12 are made more inducible according as the distance from the coil layer 12 is larger. It is therefore possible for each magnetic film to introduce an amount of magnetic flux meeting the thickness of the magnetic film from the coil layer and thus to effectively achieve a uniform magnetic flux distribution for all the magnetic films. Achievement of a uniform magnetic flux distribution of the individual magnetic films can be more effectively promoted by increasing the width for a magnetic film more distant from the coil layer 12 or forming the magnetic film more distant from the coil layer 12 from a magnetic material of a high magnetic permeability.

When the magnetic flux distribution is substantially uniform for all the magnetic films, the value of equivalent resistance can be made for all the magnetic films, and it is thus possible to reduce the total sum of equivalent resistance of the magnetic films, improve superposed DC current characteristic, and ensure an inductance equal or even superior to that conventionally available. Particularly in the high frequency band, iron loss can be reduced.

In the embodiment shown in FIGS. 1 and 2, the magnetic film has a larger width according as the distance from the coil layer is longer. The magnetic films may however have the same widths. Further in the embodiment shown in FIGS. 1 and 2, the magnetic film is made of a magnetic material having a higher magnetic permeability according as the distance from the coil layer 12 is longer. All the magnetic films may however made of magnetic materials having substantially equal values of magnetic permeability.

Figure 3:
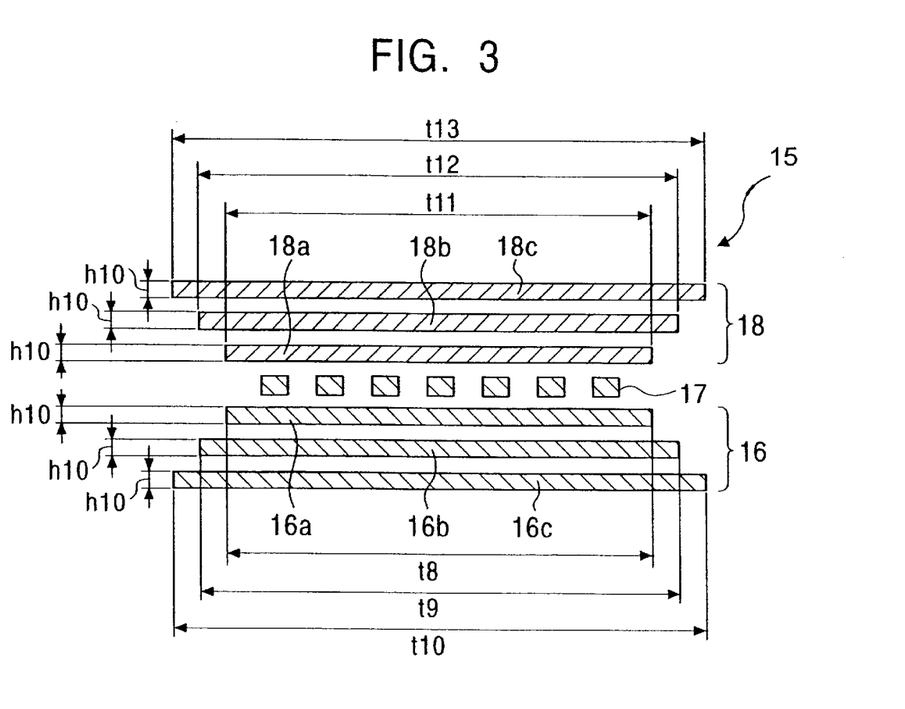
FIG. 3 is a partial sectional view illustrating the structure of another thin-film inductor (inductive element) of the invention.

FIG. 3 is a partial sectional view illustrating the structure of the thin-film inductor (inductive element) of a second embodiment of the invention.

As shown in FIG. 3, a thin-film inductor 15 comprises a first magnetic layer 16 formed on a substrate, a coil layer 17 formed into a spiral pattern on the first magnetic layer 16 via an insulating layer (not shown), and a second magnetic layer 18 formed on the coil layer 17 via an insulating layer (not shown)

In this embodiment also, the first magnetic layer 16 and the second magnetic layer 18 comprises a plurality of magnetic films 16a to 16c and 18a to 18c, respectively, laminated via an insulating layer (not shown). Adoption of the multi-layer structure for the magnetic layers 16 and 18 makes it possible to reduce eddy-current loss.

As shown in FIG. 3, all the magnetic films are formed into a uniform thickness h10. In this embodiment, a magnetic film more distant from the coil layer 17 has a larger value of product of multiplication of magnetic permeability and thickness as a result of formation of the magnetic film more distant from the coil layer from a magnetic material having a higher magnetic permeability.

As described above, the magnetic films 16a to 16c and 18a to 18c are formed from an Fe—M—O-based soft magnetic (where, M represents one or more elements selected from the group consisting of Zr, Hf, V, Nb, Ta, Mo, W, Al, Si, Cr, P, C, B, Ga, Ge and rare-earth elements) as disclosed in the U.S. Pat. No. 5,573,863, a Co—E—O-based soft magnetic selected from the group consisting of Ti, Zr, Hf, Ta, Mo, W, Al, Si, Cr, P, C, B, Ga, Ge and rare-earth elements) as disclosed in the U.S. Pat. No. 5,833,770, Co—Ta—Hf, Co—Ta—Hf—Pd, Co—Zr—Nb, Co—Zr—Ta or Co—Hf—Nb.

Magnetic permeability of the individual magnetic films can be changed not only by appropriately selecting magnetic materials having different chemical compositions having naturally different values of magnetic permeability and using the thus selected materials for the magnetic films, but also, even when forming all the magnetic films from a magnetic materials having the same composition, by changing the composition ratios of the constituent elements of the magnetic material. By forming the magnetic film more distant from the coil layer 17 from a magnetic material having a higher value of magnetic permeability, the magnetic film more distant from the coil layer 17 can make magnetic fluxes from the coil layer 17 more inducible.

In the conventional art, as in the embodiment shown in FIG. 3, all the magnetic films are formed with substantially the same thickness, resulting in a value of magnetic permeability for all the magnetic films because all the magnetic films are made of the same magnetic material. Magnetic fluxes from the coil layer concentrate on the magnetic film close to the coil layer, thus preventing formation of uniform magnetic flux distributions for all the magnetic films.

In the embodiment shown in FIG. 3, in contrast, the magnetic permeability for a magnetic film is increased according as the distance from the coil layer 17. The magnetic fluxes generated from the coil layer are therefore appropriately directed not only to the magnetic films 16a and 18a the closest to the coil layer 17, but also to the magnetic films 16b, 18c, 16c and 18c more distant from the coil layer 17, enabling to cause all the magnetic films to absorb amounts of magnetic flux substantially uniform to all the magnetic films. According to the invention, therefore, it is possible to achieve a uniform magnetic flux distribution for all the magnetic films. This makes it possible to achieve substantially equal values of equivalent resistance for all the magnetic films, reduce the total sum of equivalent resistance values of all the magnetic films improve the superposed DC current characteristic, and ensure an inductance equal or even superior to the conventionally available value inductance. Particularly in the high frequency band, it is possible to reduce iron loss.

In the embodiment shown in FIG. 3, as in the embodiment shown in FIGS. 1 and 2, the width is larger according as the distance from the coil layer becomes longer. In the first magnetic layer 16, the width is larger in the sequence of the width t8 of the magnetic film 16a, the width t9 of the magnetic film 16b, and then the width t10 of the magnetic film 16c. Similarly in the second magnetic layer 18, the width is larger in the order of the width t11 of the magnetic film 18a, the width t12 of the magnetic film 18b, and then the width of t13 of the magnetic film 18c.

By forming a magnetic film more distant from the coil layer 17 with a larger width, the both side ends of the magnetic film more distant from the coil layer 17 extend more to outside. As a result, magnetic fluxes generated from the coil layer 17 are more easily reducible to the magnetic film more distant from the coil layer 17, thus permitting achievement of a more uniform magnetic flux density for all the magnetic films.

In the embodiment of the invention, however, the magnetic films forming the magnetic layers 16 and 18 may have substantially the same width.

Figure 4:
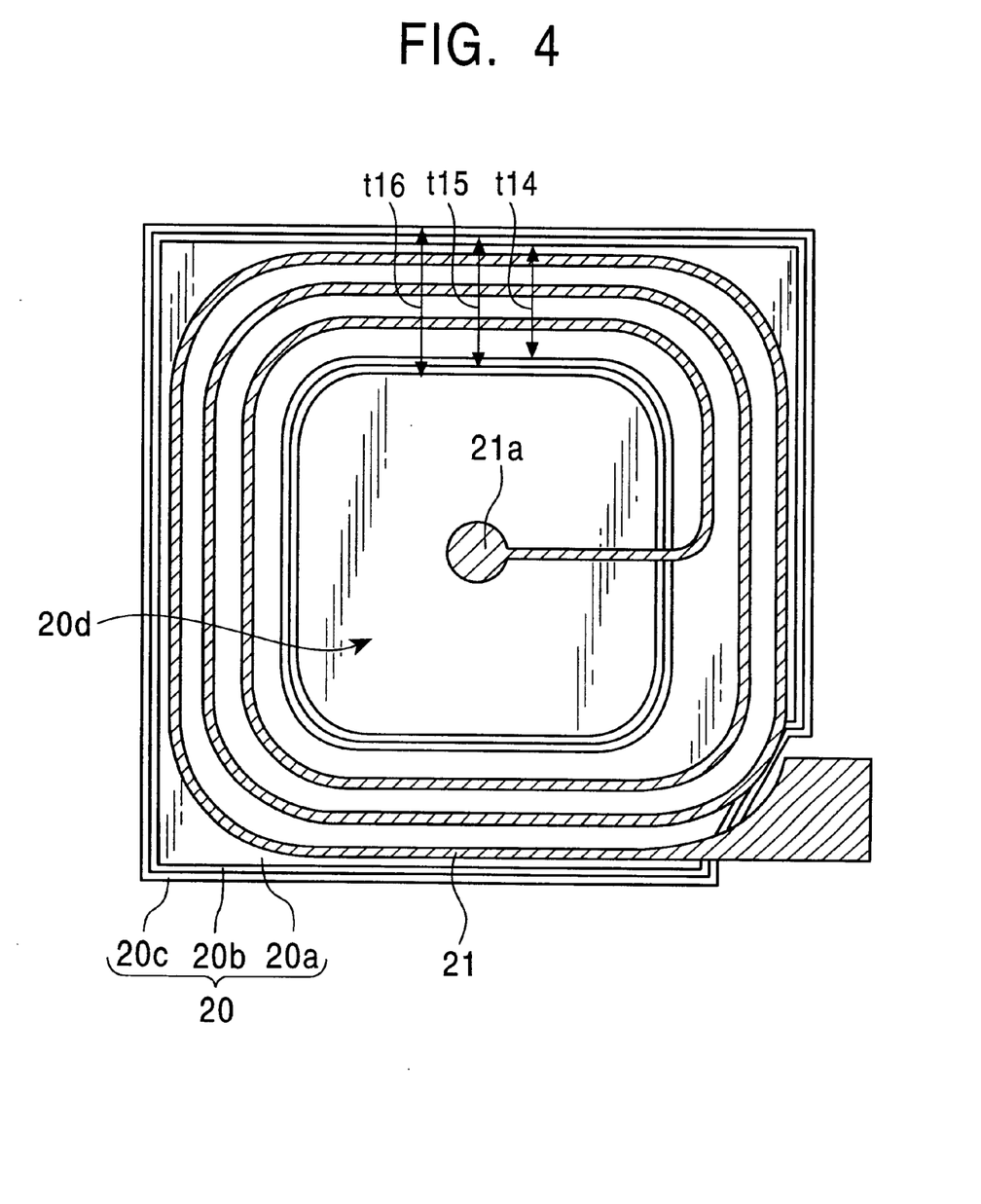
FIG. 4 is a partial plan view illustrating the structure of still another thin-film inductor (inductive element) of the invention.

FIG. 4 is a partial plan view illustrating the structure of the thin-film inductor (inductive element) in a third embodiment of the invention. The second magnetic layer is omitted in the drawing from the thin-film inductor shown in FIG. 4.

As shown in FIG. 4, a first magnetic layer 20 comprises a plurality of magnetic films 20a to 20c laminated via an insulating layer (not shown). A coil layer 21 is spirally pattern-formed on the first magnetic layer 20 via an insulating layer (not shown) A second magnetic layer not shown is formed on the coil layer 21 via an insulating layer (not shown). The second magnetic layer comprises, similarly to the first magnetic layer 20, a plurality of magnetic films in lamination.

In this embodiment, a magnetic film more distant from the coil layer 21 is formed with a larger thickness. As shown in FIG. 4, a throughhole 20d passing through from the magnetic film 20a to the magnetic film 20c is pierced at the center of the magnetic layer 20. The winding center 21a of the coil layer 21 is electrically connected to an outgoing electrode (not shown) communicating with outside through the throughhole 20d.

In this embodiment, as shown in FIG. 4, a magnetic film more distant from the coil layer 21 is formed with a larger width. The magnetic film 20a the closest to the coil layer 21 is formed with a width t14; the magnetic film 20b close to the coil layer 21 next to the magnetic film 20a is formed with a width t15; and the magnetic film 20c the most distant from the coil layer 21 is formed with a width t16. The width is larger in the order of the width t14 of the magnetic film 20a, the width t15 of the magnetic film 20b, and then, the width t16 of the magnetic film 20c.

By forming the magnetic film more distant from the coil layer 21 with a larger width, the both side ends of the magnetic film more distant from the coil layer 21 extend more from the inside diameter and the outside diameter of the coil layer 21.

In this embodiment, more specifically, even within the hole 20d formed in the magnetic layer 20, the side ends of a magnetic film more distant from the coil layer 21 extend more toward the center of the hole 20d. Even within the hole 20d, therefore, the magnetic film more distant from the coil layer can more easily introduce magnetic fluxes from the coil layer 21.

In this embodiment, therefore, the magnetic film more distant from the coil layer 21 can more easily induce magnetic fluxes from the coil layer 21 more effectively. It is therefore possible to cause an appropriate dispersion of fluxes from the coil layer 21 to all the magnetic films, thereby permitting achievement of a more uniform magnetic flux distribution for all the magnetic layers.

A magnetic film more distant from the coil layer should preferably be formed from a magnetic material having a higher magnetic permeability. All the magnetic films may be made of magnetic materials having substantially uniform values of magnetic permeability.

Figure 5:
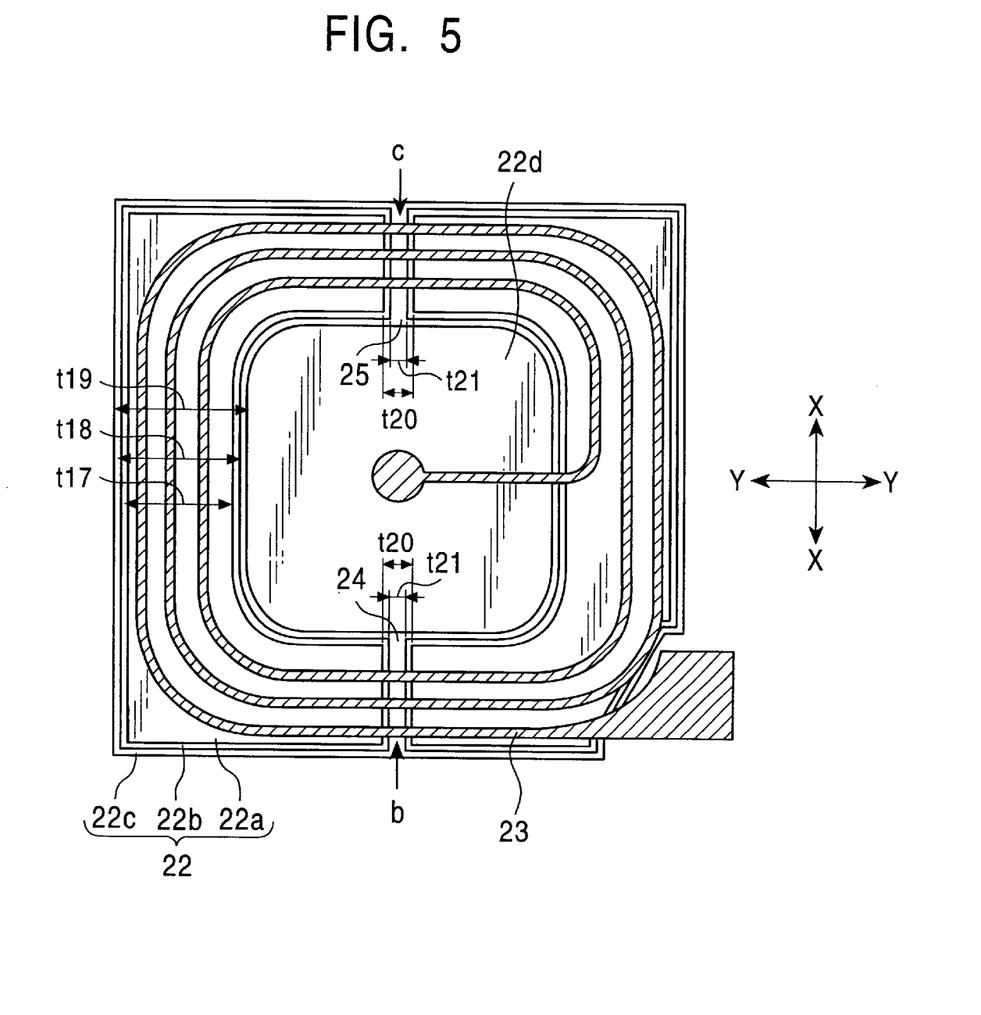
FIG. 5 is a partial plan view illustrating the structure of further another thin-film inductor (inductive element) of the invention.

FIG. 5 is a partial plan view illustrating the thin-film inductor (inductive element) of a fourth embodiment of the invention. The second magnetic layer is omitted in the drawing from the thin-film inductor shown in FIG. 5.

As shown in FIG. 5, a first magnetic layer 22 comprises a plurality of magnetic films 22a to 22c in lamination via an insulating layer (not shown) , and a coil layer 23 is spirally pattern-formed on the first magnetic layer 22 via an insulating layer (not shown). A second magnetic layer not shown is formed on the coil layer 23 via an insulating layer 23. The second magnetic layer comprises, as the first magnetic layer 22, a plurality of magnetic films in lamination.

In this embodiment, as shown in FIG. 5, a hole 22d passing through the magnetic films 22a to 22c is pierced at the center of the magnetic layer 22.

In this embodiment as well, a magnetic film more distant from the coil layer 23 should preferably a larger thickness with a view to promoting achievement of a uniform magnetic flux density distribution. The magnetic films may however be formed with substantially the same thickness as in the conventional art.

Further as shown in FIG. 5, a magnetic film more distant from the coil layer 23 is formed with a larger width. As shown in FIG. 5, the magnetic film 22a the closest to the coil layer 23 has a width t17; the magnetic film 22b close to the coil layer 23 next to the magnetic film 22a has a width t18; and the magnetic film 22c the most distant from the coil layer 23 has a width t19.

By forming a magnetic film more distant from the coil layer 23 with a larger width, the both side ends of the magnetic film more distant from the coil layer 23 extend to outside from the inner diameter and the outside diameter of the coil layer 23.

In this embodiment, as shown in FIG. 5, slits 24 and 25 are provided in arrow directions b and c, respectively on the magnetic film 22b and the magnetic film 22a formed on the magnetic film 22c. The magnetic film 22a and the magnetic film 22b are thus separated from each other.

The slits 24 and 25 (in directions b and c) should preferably be provided in a direction of hard magnetization (in the X-direction in FIG. 5). The amount of fluxes from the coil layer 23 is large in the direction of hard magnetization (in the X-direction in FIG. 5) in which the magnetic permeability is high in all the magnetic films. As a result, if the magnetic flux density distribution is visualized for the individual magnetic film, a magnetic film has a higher magnetic flux density region in a portion formed in the X-direction in FIG. 5 than in a portion of the magnetic film formed in the Y-direction in FIG. 5.

When the slits 24 and 25 provided on the magnetic film 22a and the magnetic film 22b are formed in the same direction as the direction of hard magnetization, the magnetic films 22a and 22b would be separated in parallel with the direction of hard magnetization (in X-direction in FIG. 5) by the formation of the slits 24 and 25. More specifically, the portion having the slits 24 and 25 formed thereon are portions where the amount of magnetic flux induced from the coil layer 23 is large for the magnetic films, thus making it easier to induce a sufficient amount of magnetic flux even in a magnetic film distant from the coil layer 23.

Further, as shown in FIG. 5, the magnetic film 22a the closest to the coil layer 23 has slits 24 and 25 with a width t20, and the magnetic film 22b close to the coil layer 23 next to the magnetic film 22a has slits 24 and 25 with a width t21. Thus the magnetic film 22a closer to the coil layer 23 have slits 24 and 25 having a larger width.

The fluxes generated from the coil layer 23 are more easily inducible in the order of the magnetic film 22a formed with the slits 24 and 25 having a width t20, the magnetic film 22b formed with the slits 24 and 25 having a width t21 smaller than the width t20, and then, the magnetic film 22c formed at a position the most distant from the coil layer 23 with no slit. It is therefore possible to achieve a substantially uniform magnetic flux distribution for all the magnetic films more effectively.

Due to the fact that the magnetic film the most distant from the coil layer plays the role of a shield, and a slit or a notched portion is formed on at least one magnetic films except for the most distant one, it is possible to prevent fluxes from concentrating on the magnetic film the closest to the coil layer, and achieve a uniform magnetic flux density distribution for the individual magnetic films, thereby permitting reduction of equivalent resistance. It is consequently possible, in this embodiment of the invention, to reduce the total sum of the values of equivalent resistance for all the magnetic films, improve the superposed DC current characteristic, and ensure an inductance equal or even superior to the conventionally available one.

In this embodiment as well, while a magnetic film more distant from the coil layer 23 should preferably be formed from a magnetic material having, a higher magnetic permeability, all the magnetic films may be formed from magnetic materials having substantially a uniform magnetic permeability.

When the magnetic flux density distribution is substantially uniform for all the magnetic films as described above, the magnetic films can have substantially the same values of equivalent resistance, and it is possible to reduce the total sum of values of equivalent resistance for the individual magnetic films, improve the superposed DC current characteristic and ensure and inductance equal or even superior to the conventionally available one. Particularly in the high frequency band, it is possible to reduce iron loss.

In the embodiment shown in FIG. 5, the two slits 24 and 25 are formed, and more slits may be formed. The magnetic films may be separated by providing a notch halfway, not by means of a slit. While the slits 24 and 25 are provided in the magnetic films 22a and 22b in FIG. 5, a slit may be formed on the magnetic film 22c. In this case, the width of the slit formed on the magnetic film 22c should preferably be smaller than the width of the slits formed on the magnetic films 22a and 22b. Further, the slits 24 and 25 may be formed only on the magnetic film 22a at the position closest to the coil layer 23.

According to this embodiment of the invention, as described above in detail, the fluxes from the coil layer become more easily inducible to the magnetic film more distant from the coil layer by adjusting the thickness or the width of the plurality of magnetic films composing the magnetic layer or improving the material therefor, thus permitting formation of substantially a uniform magnetic flux distribution for all the magnetic films.

Achievement of substantially a uniform magnetic flux distribution makes it possible to achieve substantially the same value of equivalent resistance for all the magnetic films, reduce the total sum of values of equivalent resistance for all the magnetic films, improve the superposed DC current characteristic, and ensure an inductance equal or even superior to the conventionally available one. Particularly in the high frequency band, it is possible to reduce iron loss.

While the first magnetic layer and the second magnetic layer are provided on and under the coil layer via insulating layers in the above-mentioned embodiment, the invention is applicable also to an inductive element of the type in which at least one magnetic layer is formed on the coil layer via an insulating layer.

In the embodiment described above, both the first magnetic layer and the second magnetic layer are formed of a plurality of magnetic films in lamination. In the invention, however, it is also possible to adopt a configuration in which any of the first magnetic layer and the second magnetic layer comprises a plurality of magnetic films in lamination. In the embodiment described above, the magnetic layers have a lamination structure comprising three magnetic films in the drawing. The magnetic layer may have two magnetic films, or more than three magnetic films. The number of magnetic films should be within a range of from 2 to 12.

It is not always necessary that the thickness of the magnetic films is different from each other, but two magnetic films may form a set and the thickness of each magnetic film may be different from a set to another.

The above-mentioned embodiments represent the most desirable forms in all cases, and the present invention is applicable in a form other than those shown in FIGS. 1 and 5.

In the invention, for any two of the magnetic films forming the magnetic layer, the value of product of multiplication of magnetic permeability and thickness of the magnetic film closer to the coil layer suffices to be smaller than the value of product of magnetic permeability and thickness of the magnetic film more distant from the coil layer.

As shown in FIGS. 1 to 5, when the magnetic layer has three superposed magnetic films, the value of product of multiplication of magnetic permeability and thickness of the magnetic film the closest to the coil layer should preferably be smaller than the value of product of multiplication of magnetic permeability and thickness of the other magnetic films, and more preferably, the value of product of multiplication of magnetic permeability and thickness of the magnetic film the most distant from the coil layer should be larger than the value of product of publication of magnetic permeability and thickness of the other magnetic film.

More specifically, for any two magnetic films forming a magnetic layer 11 or 13 shown in FIGS. 1 and 2, the value of product of multiplication of magnetic permeability and thickness of the magnetic film closer to the coil layer 12 suffices to be smaller than the value of product of multiplication of magnetic permeability and thickness of the magnetic film more distant from the coil layer 12.

In addition to the aforementioned configurations, the value of product of multiplication of magnetic permeability and thickness of the magnetic films 11a and 13a the closest to the coil layer 12 should preferably be the smaller as compared with the value of product of multiplication of magnetic permeability and thickness of the other magnetic films, or more preferably, in addition to the aforementioned configurations, the value of product of multiplication of magnetic permeability and thickness of the magnetic films 11c and 13c the most distant from the coil layer 12 should be the largest as compared with the value of product of multiplication of magnetic permeability and thickness of the other magnetic films.

In the aforementioned embodiments of the invention, a magnetic film more distant from the coil layer is formed with a larger width so that the both side ends of a magnetic film extend sideways from the both side ends of a magnetic film closer to the coil layer than the above magnetic film as a preferred configuration for all the embodiments. In the invention, however, the both side ends of the magnetic film the closest to the coil layer from among the magnetic films forming a magnetic layer suffice to be located on the center side more than the both side ends of at least one of the other magnetic films, or the both side ends of the magnetic film the most distant from the coil layer from among the magnetic films forming one magnetic layer suffice to be formed so as to extend sideways more than the both side ends of at least one of the other magnetic films.

Even with the aforementioned configuration, it is possible in the invention to avoid concentration of magnetic fluxes from the coil layer on at least a magnetic film the closest to the coil layer, or preferably, form a uniform magnetic flux distribution for all the magnetic films, and inhibit high-frequency loss.

The thin-film inductor which is a planar magnetic element has been described in the aforementioned embodiment of the invention. The invention is applicable also to other inductive element such as a thin-film transformer having a primary plan coil and a secondary flat coil which are identical planer magnetic elements. The invention is further applicable also to an inductive element having a multi-layered magnetic layer.

The thin-film inductor and the thin-film transformer are thin-film magnetic element manufactured through a process having a thin film forming step.

EXAMPLES

A hole was pierced at the center of a magnetic layer as in the thin film inductor shown in FIG. 4, and magnetic flux distribution for each magnetic film was measured by the three-dimensional finite element method (FEM) by changing the thickness and the width of the magnetic films forming the magnetic layer. The conditions for experiment will first be described.

A coil layer composing the thin-film inductor was formed with a conductor width of 60 $\mu$m and a conductor interval of 25 $\mu$m, and further, with six winding turns.

The magnetic films forming the magnetic layer were formed from a magnetic material having a relative magnetic permeability of $\mu_{hard}$=1,8000 in the direction of hard magnetization and $\mu_{easy}$=300 in the direction of easy magnetization, and a specific resistance of 1,000 $\mu\Omega$.cm. An interval (gap length) of 70 $\mu$m was provided between the first magnetic layer and the second magnetic layer.

Another conditions included a driving frequency of 5 MHz and an excitation current for the foil layer of 0.3 A (peak to peak; represented by (P-P)).

The thicknesses and the widths of the magnetic films in comparative examples and examples of the invention will now be described.

First, the magnetic layer of the thin-film inductor serving as comparative example 1 had a configuration comprising three magnetic films in lamination. All the magnetic films were formed with a thickness of 2.0 $\mu$m and with the same width.

The magnetic layer of the thin-film inductor serving as comparative example 2 had a configuration comprising three magnetic films in lamination. All the magnetic films were formed with a thickness of 2.0 $\mu$m, and a magnetic film more distant from the coil layer was formed with a larger width so that the amount of overhang (the width by which the side end of a magnetic film extends from the side end of a magnetic film closer to the coil layer) becomes 150 $\mu$m.

The magnetic layer of the thin-film inductor serving as comparative example 3 had a configuration comprising three magnetic films in lamination. The magnetic film the closest to the coil layer was formed with a thickness of 3 $\mu$m; the magnetic film next close to the coil layer, with a thickness of 2 $\mu$m; and the magnetic film the most distant from the coil layer, with a thickness of 1 $\mu$m. A magnetic film more distant from the coil layer was formed with a larger width so that there is an amount of overhang of 150 $\mu$m.

The magnetic layer of the thin-film inductor serving as example 1 had a configuration comprising three magnetic films in lamination. The magnetic film the closest to the coil layer was formed with a thickness of 1 $\mu$m; the magnetic film next close to the coil layer, with a thickness of 2 $\mu$m; and the magnetic film the most distant from the coil layer, with a thickness of 3 $\mu$m; and further, a magnetic film more distant from the coil layer was formed with a larger width so as to give an amount of overhang of 150 $\mu$m.

FIGS. 6A, 7A, 8A, and 9A represent the magnetic flux distribution of the magnetic film formed at a position the most distant from the coil layer; FIGS. 6A, 7A, 8A, and 9B, the magnetic flux distribution of the magnetic films formed at a middle position; and FIGS. 6A, 7A, 8A, and 9C, the magnetic flux distribution of the magnetic film formed at a position the closest to the coil layer. Regions of magnetic flux density of 0.4 T, 0.3 T, and 0.1~0.2 T (stella) are shown.

In each of these drawings, A represents the magnetic flux distribution of the magnetic film formed at a position the most distant from the coil layer; B, the magnetic flux distribution of the magnetic films formed at a middle position; and C, the magnetic flux distribution of the magnetic film formed at a position the closest to the coil layer.

Figure 6A:
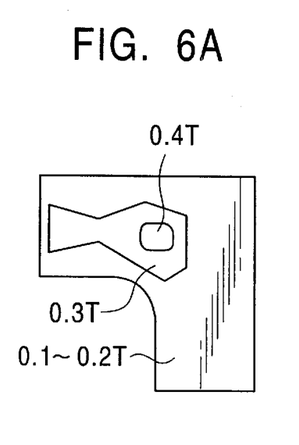
FIG. 6A is schematic view illustrating the magnetic flux distribution in a magnetic film most distant from the coil layer when all the magnetic films have the same thickness and the same width.
Figure 6B:
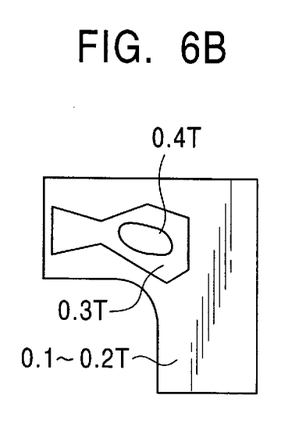
FIG. 6B is a schematic view illustrating the magnetic flux distribution in a magnetic film at an intermediate distance from the coil layer when all the magnetic films have the same thickness and the same width.
Figure 6C:
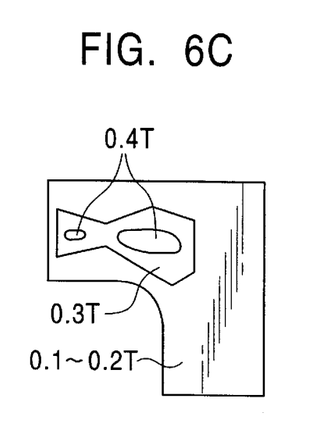
FIG. 6C is a schematic view illustrating the magnetic flux distribution in a magnetic film closest to the coil layer when all the magnetic films have the same thickness and the same width.

FIG. 6 is a schematic view of the magnetic flux distribution for each magnetic film of comparative example 1. As shown in FIG. 6, the magnetic flux density region of 0.4 T (stella) of the magnetic film the closest to the coil layer (shown in FIG. 6C) gradually becomes smaller according as the distance from the coil layer is larger (in the sequence of FIG. 6B and then FIG. 6A), suggesting that magnetic flux density distribution is non-uniform for the individual magnetic films.

Figure 7A:
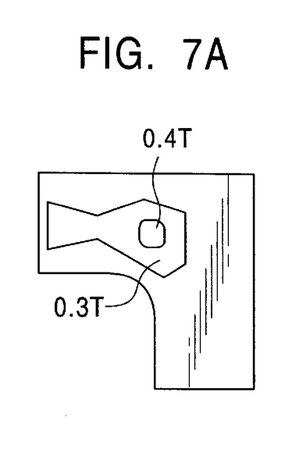
FIG. 7A is a schematic view illustrating the magnetic flux distribution in a magnetic film most distant from the coil layer when all the magnetic films have the same thickness and increase in size with an increase in distance.
Figure 7B:
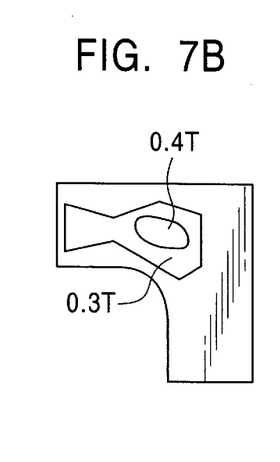
FIG. 7B is a schematic view illustrating the magnetic flux distribution in a magnetic film at an intermediate distance from the coil layer when all the magnetic films have the same thickness and have overhang.
Figure 7C:
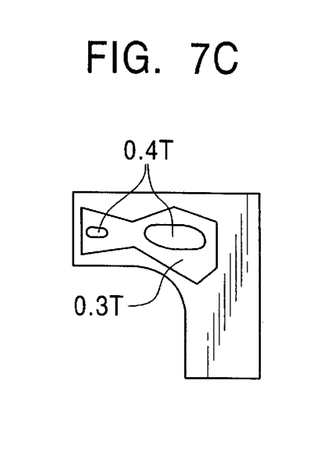
FIG. 7C is a schematic view illustrating the magnetic flux distribution in a magnetic film closest to the coil layer when all the magnetic films have the same thickness have overhang.

FIG. 7 is a schematic view of the magnetic flux distribution for each magnetic film of comparative example 2. In this case, as in FIG. 6, the magnetic flux density region of 0.4 T of the magnetic film the closest to the coil layer (shown in FIG. 7C) gradually becomes smaller according as the distance from the coil layer is larger (in the sequence of FIG. 7B and then FIG. 7A), suggesting that the magnetic flux density distribution in non-uniform for the individual magnetic films.

When forming all the magnetic films with the same thicknesses and the same widths (comparative example 1), and when forming all the magnetic films with the same thicknesses and making the magnetic films to have overhang (comparative example 2), it is impossible to uniformly form a magnetic flux density distribution for the magnetic film in any of these cases.

Figure 8A:
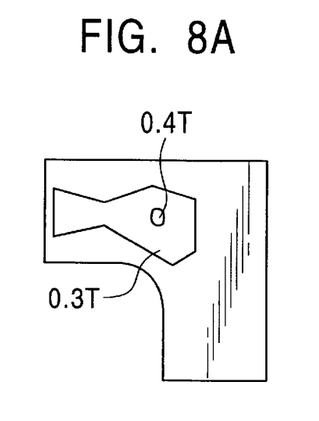
FIG. 8A is a schematic view illustrating the magnetic flux distribution in a magnetic film most distant from the coil layer when the magnetic films decease in thickness with increasing distance from the coil layer and have overhang.
Figure 8B:
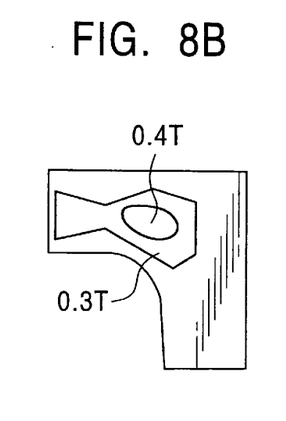
FIG. 8B is a schematic view illustrating the magnetic flux distribution in a magnetic film at an intermediate distance from the coil layer when the magnetic films decease in thickness with increasing distance from the coil layer and have overhang.
Figure 8C:
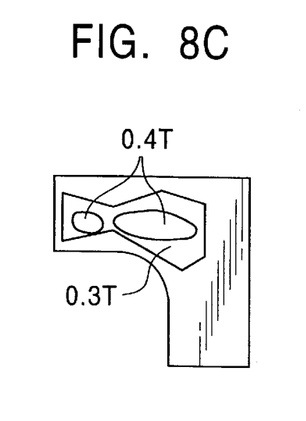
FIG. 8C is a schematic view illustrating the magnetic flux distribution in a magnetic film closest to the coil layer when the magnetic films decease in thickness with increasing distance from the coil layer and have overhang.

Then, FIG. 8 is schematic view of the magnetic flux distribution of the magnetic films of comparative example 3. In this case, the magnetic flux density region of 0.4 T of the magnetic film the closest to the coil layer (shown in FIG. 8C) is very large as compared with the cases of FIG. 8B and FIG. 8A. In this comparative example 3, the magnetic flux density distribution of the magnetic films is further more non-uniform than in comparative examples 1 and 2.

In the case of comparative example 3, a magnetic film more distant from the coil layer is formed with a smaller thickness. In this structure, even as compared with the cases of comparative examples 1 and 2, magnetic fluxes generated from the coil layer are further concentrated on the thick magnetic film the closest to the coil layer and are not introduced almost at all to the thin magnetic film the most distant from the coil layer.

By forming a magnetic film more distant from the coil layer with a smaller thickness, non-uniform magnetic flux distribution is promoted most.

Figure 9A:
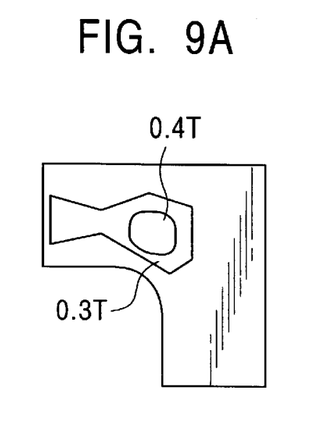
FIG. 9A is a schematic view illustrating the magnetic flux distribution in a magnetic film most distant from the coil layer when the magnetic films increase in thickness with increasing distance from the coil layer and have overhang.
Figure 9B:
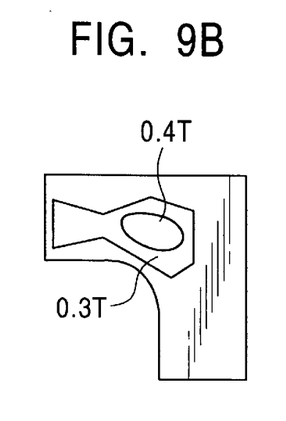
FIG. 9B is a schematic view illustrating the magnetic flux distribution in a magnetic film at an intermediate distance from the coil layer when the magnetic films increase in thickness with increasing distance from the coil layer and have overhang.
Figure 9C:
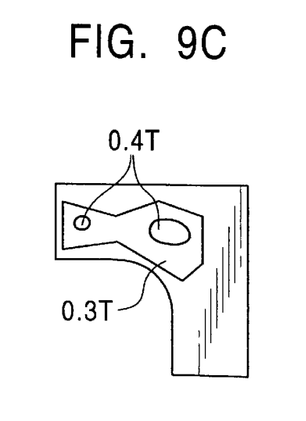
FIG. 9C is a schematic view illustrating the magnetic flux distribution in a magnetic film closest to the coil layer when the magnetic films increase in thickness with increasing distance from the coil layer and have overhang.

FIG. 9 is a schematic view of the magnetic flux density distribution of magnetic films in example 1. As shown in FIG. 9, all the magnetic films have substantially the same magnetic flux density distributions. In example 1 shown in FIG. 9, a magnetic film more distant from the coil layer is formed with a larger thickness. As a result, magnetic flux is more easily inducible from the coil layer to a magnetic film more distant from the coil layer, and magnetic fluxes from the coil layer are appropriately dispersed among the magnetic films, thus permitting formation of substantially uniform magnetic flux density distribution for the individual magnetic film.

Equivalent resistance for a magnetic layer when changing the value of product of multiplication of magnetic permeability and thickness of a magnetic film was measured by the three-dimensional finite element method (FEM) for all the magnetic films forming the magnetic layer. Conditions of experiment will first be described.

A coil layer composing a thin-film inductor was formed with a conductor width of 60 $\mu$m, a conductor interval of 25 $\mu$m and six winding turns.

Each of the magnetic films forming the magnetic layer was formed from a magnetic material having a relative magnetic permeability of $\mu_{hard}$=1,800 in the direction of hard magnetization and $\mu_{easy}$=300 in the direction of easy magnetization, and a specific resistance of 1,000 $\mu\Omega$·cm, with an interval (gap length) between the first magnetic layer and the second magnetic layer of 70 $\mu$m.

Further conditions included a driving frequency of 5 MHz and an excitation current to be fed to the coil layer of 0.3 A (peak to peak: expressed as (P-P)).

The individual magnetic films in the comparative examples and the examples will now be described.

The magnetic layer of the thin-film inductor serving as a comparative example 4 comprised a single magnetic film having a thickness of 6 $\mu$m.

The magnetic layer of the thin-film inductor serving as a comparative example 5 had a configuration comprising three magnetic films in lamination. All the magnetic films were formed with a thickness of 2.0 $\mu$m and with the same widths. The value of product of multiplication of magnetic permeability ($\mu$) in the direction of hard magnetization and thickness was 3,600 for all the magnetic films.

The magnetic layer of the thin-film inductor serving as a comparative example 6 had a configuration comprising three magnetic films in lamination. The magnetic film the closest to the coil layer was formed with a thickness of 3 $\mu$m; the magnetic film next close to the coil layer, a thickness of 2 $\mu$m; and the magnetic film the most distant from the coil layer, a thickness of 1 $\mu$m, all with the same widths. The value of product of multiplication of magnetic permeability ($\mu$) in the direction of hard magnetization and thickness (t) was 5,400, 3,600 and 1,800 for the magnetic films in the order from the one closer to the coil layer.

The magnetic layer of the thin-film inductor serving as a comparative example 7 had a configuration comprising three magnetic films in lamination. All the magnetic films were formed with a thickness of 2.0 $\mu$m and with the same widths. A slit in the direction of hard magnetization as in the magnetic layer of the thin-film inductor shown in FIG. 5 was provided on the magnetic film the closest to the coil layer and the magnetic film at the middle. The value of product of multiplication of magnetic permeability ($\mu$) in the direction of hard magnetization and thickness (t) was 3,600 for all the magnetic films.

The magnetic layer of the thin-film inductor serving as a comparative example 8 had a configuration comprising three magnetic films in lamination. The magnetic film the closest to the coil layer was formed with a thickness of 3 $\mu$m; the magnetic film next close to the coil layer, with a thickness of 2 $\mu$m; and the magnetic film the most distant from the coil layer, with a thickness of 1 $\mu$m, all the magnetic films being formed with the same widths. Slits in the direction of hard magnetization identical with those in the magnetic layer of the thin-film inductor shown in FIG. 5 were provided on the magnetic film the closest to the coil layer and the middle magnetic film. The value of product of multiplication of magnetic permeability ($\mu$) in the direction of hard magnetization and thickness (t) for the individual magnetic films was 5,400, 3,600 and then 1,800 in the order from the magnetic film closer to the coil layer.

The magnetic layer of the thin-film inductor serving as an example 2 had a configuration comprising three magnetic films in lamination. The magnetic film the closest to the coil layer was formed with a thickness of 1 $\mu$m; the magnetic layer next close to the coil layer, with a thickness of 2 $\mu$m; and the magnetic film the most distant from the coil layer, all the magnetic films being formed with the same widths. The value of product of multiplication of magnetic permeability ($\mu$) in the direction of hard magnetization and thickness (t) for the individual magnetic films was 1,800, 3,600 and then 5,400 in the order from the magnetic film closer to the coil layer.

The magnetic film of the thin-film inductor serving as an example 3 had a configuration comprising three magnetic films in lamination. The magnetic film the closest to the coil layer was formed with a thickness of 1 $\mu$m; the magnetic film next close to the coil layer, with a thickness of 2 $\mu$m; and the magnetic film the most distant from the coil layer, with a thickness of 3 $\mu$m, all the magnetic films being formed with the same widths. Slits in the direction of hard magnetization such as those in the magnetic layer of the inductor shown in FIG. 5 were provided in the magnetic film the closest to the coil layer and the middle magnetic film. The value of product of multiplication of magnetic permeability ($\mu$) in the direction of hard magnetization and thickness (t) for the magnetic films was 1,800, 3,600 and then 5,400 in the order from the magnetic film close to the coil layer.

An $Al_2O_3$ layer having a thickness of 0.2 $\mu$m was formed between the magnetic films of each of comparative examples 5 to 8 and example 2 and 3.

The result is shown in Table 1. In Table 1, the magnetic film the closest to the coil layer is called the magnetic film 1, the magnetic film next close to the coil layer, the magnetic film 2, and the magnetic film the most distant from the coil layer, the magnetic layer 3.

TABLE 1

| Sample | $\mu \times t$ | | | Equivalent Resistance |
| --- | --- | --- | --- | --- |
| | Magnetic Film 1 | Magnetic Film 2 | Magnetic Film 3 | |
| Comparative Example 4 | — | — | — | 1.160 |
| Comparative Example 5 | 3600 | 3600 | 3600 | 1.142 |

TABLE 1-continued

| Sample | μ × t Magnetic Film 1 | Magnetic Film 2 | Magnetic Film 3 | Equivalent Resistance |
|---|---|---|---|---|
| Comparative Example 6 | 5400 | 3600 | 1800 | 1.187 |
| Comparative Example 7 | 3600 | 3600 | 3600 | 0.820 |
| Comparative Example 8 | 5400 | 3600 | 1800 | 0.885 |
| Example of Invention 2 | 1800 | 3600 | 5400 | 1.118 |
| Example of Invention 3 | 1800 | 3600 | 5400 | 0.788 |

In Table 1, comparison of comparative examples 4, 5 and 6 and example 2 demonstrates that the total sum of values of equivalent resistance for the individual magnetic films is lower in comparative example 5 in which the magnetic layer was formed from three magnetic films having the same thicknesses than in comparative example 4 in which the magnetic layer was formed with a single magnetic film.

It is also revealed that the total sum of values of equivalent resistance of the magnetic films is lower in example 2 in which a magnetic film more distant from the coil layer is formed with a larger thickness than in comparative example 5 in which all the three magnetic films had the same thicknesses.

Because the individual magnetic films have the same values of magnetic permeability, the value of product of multiplication of magnetic permeability ($\mu$) in the direction of hard magnetization and thickness (t) is larger according as the distance from the coil layer is longer by forming a magnetic film more distant from the coil layer with a larger thickness, thus making it easier for magnetic fluxes from the coil layer to be induced from the coil layer, and making it possible to achieve substantially a uniform magnetic flux distribution for all the magnetic films.

When the magnetic flux distribution becomes substantially uniform for all the magnetic films, as described above, values of equivalent resistance can be kept at substantially the same level, thus permitting achievement an inductance equal to or even superior to the conventionally available one, and improvement of the superposed DC current characteristic. Particularly in high frequency band, it is possible to reduce iron loss.

On the contrary, when a magnetic film more distant from the foil layer is formed with a smaller thickness as in comparative example 6, the value of product of multiplication of magnetic permeability ($\mu$) in the direction of hard magnetization and thickness (t) of the magnetic film is smaller according as the distance from the coil layer becomes longer, thus leading to a more serious non-uniformity of magnetic flux distribution among the magnetic films. As a result, the total sum of values of equivalent resistance for the magnetic films in comparative example 6 is larger than in comparative example 4 in which the magnetic layer comprises a single magnetic film.

Similarly, in comparative examples 7 and 8 and example 3 in which a slit in the direction of hard magnetization is provided in the magnetic film, as well, the value of product of multiplication of magnetic permeability ($\mu$) in the direction of hard magnetization and thickness (t) of the magnetic film becomes larger according as the distance from the coil layer becomes longer as in example 3, and the total sum of values of equivalent resistance of the magnetic films is the lowest. Further, the total sum of values of equivalent resistance in example 3 is lower than the total sum of values of equivalent resistance of the magnetic films, thus suggesting the effect of forming a slit in the direction of hard magnetization in the magnetic films.

The term the total sum of values of equivalent resistance of the magnetic films means the total sum of values for the six magnetic films forming the two magnetic layers with the coil layer in between.

While the comparative examples and the examples were carried out so that the thickness of magnetic layer as a whole comprising three magnetic films is 6 $\mu$m, the thickness of the magnetic layer as a whole may freely be changed.

For example, when forming a magnetic layer with three magnetic films to achieve a total thickness of the magnetic layer of 9 $\mu$m, the magnetic films may be formed into thicknesses of 1.5 $\mu$m, 3.0 $\mu$m and 4.5 $\mu$m in the order from the magnetic film the closest to the coil layer. When forming a magnetic layer with three magnetic films to achieve a total thickness of the magnetic layer of 12 $\mu$m, the magnetic films may be formed into thicknesses of 2.0 $\mu$m, 4.0 $\mu$m and 6.0 $\mu$m in the order from the magnetic film the closest to the coil layer. In such a case, by using values of magnetic permeability equal to each other for all the magnetic films and values of product of multiplication of magnetic permeability and thicknesses of the magnetic films becoming larger according as the distance from the coil layer becomes longer, it is possible to make magnetic from the coil layer more inducible to a magnetic film more distant from the coil layer, and achieve a substantially uniform magnetic flux distribution for all the magnetic films as compared with the case where all the magnetic films are formed with a uniform thickness.

By increasing the thickness of the entire magnetic layer, it is possible to increase inductance of the inductive element.

The preferable range of the value of product of multiplication of magnetic permeability and thickness for each of the magnetic films forming the magnetic larger is, for example, from 1,800 to 10,800.

According to the embodiments of the present invention, as described above in detail, concentration of magnetic fluxes on a magnetic film close to the coil layer can be avoided by using, for any two magnetic films composing the magnetic layer, a value of the product of multiplication of magnetic permeability end thickness of a magnetic film distant from the coil layer smaller than a value of the product of multiplication of magnetic permeability and thickness of a magnetic film close to the coil layer.

It is possible to avoid concentration of magnetic fluxes on a magnetic film close to the coil layer and make fluxes more easily inducible to a magnetic film more distant from the coil layer, for example, by using a smaller value of product of multiplication of magnetic permeability and thickness of the magnetic film the closest to the coil layer than the value of product of multiplication of magnetic permeability and thickness of the other magnetic films, or, by using a larger value of product of multiplication of magnetic permeability and thickness of the magnetic film the most distant from the coil layer than the value of product of multiplication of magnetic permeability and thickness of the other magnetic films, or more preferably, by using a gradually larger value of product of multiplication of magnetic permeability and thickness according as the distance from the coil layer becomes longer.

According to the embodiments of the invention, for any two magnetic films forming the magnetic layer, it is possible to avoid concentration of magnetic fluxes on a magnetic film close to the coil layer by using a smaller thickness of a magnetic film close to the coil layer than the thickness of a magnetic film distant from the coil layer.

Further, according to the embodiments of the invention, for any two magnetic films forming the magnetic layer, it is possible to avoid concentration of magnetic fluxes on a magnetic film close to the coil layer by using a smaller value of magnetic permeability of a magnetic material for a magnetic film close to the coil layer than the value of magnetic permeability of a magnetic material for a magnetic film distant from the coil layer.

It is thus possible to obtain a substantially uniform magnetic flux distribution for all the magnetic films, and cause all the magnetic films to function uniformly.

According to the embodiments of the invention, furthermore, by appropriately adjusting thickness or magnetic permeability of the magnetic films, it is possible to set values of equivalent resistance of the magnetic films to substantially the same value, and improve the superposed DC current characteristic as compared with conventionally available one. Decrease in inductance can be inhibited. In the high frequency band, it is also possible to reduce iron loss.

What is claimed is:

1. An inductive element comprising a coil layer, and a magnetic layer covering said coil layer via an insulating layer; said magnetic layer being formed of at least two superposed magnetic films, for any two magnetic films forming said magnetic layer, a product of magnetic permeability and thickness of a magnetic film closer to said coil layer is smaller than a product of magnetic permeability and thickness of a magnetic film more distant from said coil layer.

2. An inductive element according to claim 1, wherein said magnetic layer has at least three superposed magnetic films, and the product of magnetic permeability and thickness of the magnetic film closest to said coil layer is smaller than the product of magnetic permeability and thickness of either other magnetic film.

3. An inductive element according to claim 1, wherein said magnetic layer has at least three superposed magnetic films, and the product of magnetic permeability and thickness of the magnetic film most distant from said coil layer is larger than the product of the magnetic permeability and thickness of either other magnetic film.

4. An inductive element according to claim 1, wherein said magnetic layer has at least three superposed magnetic films, and the product of magnetic permeability and thickness of said magnetic films is sequentially larger with increasing distance of the respective magnetic films from said coil layer.

5. An inductive element according to claim 1, wherein the magnetic film closest to the coil layer from among the magnetic films forming said magnetic layer is formed such that both side ends thereof are located closer to a center of the coil layer than both side ends of at least one of the other magnetic films.

6. An inductive element according to claim 1, wherein the magnetic film the most distant from the coil layer from among the magnetic films forming said magnetic layer is formed such that both side ends thereof extend sideways from both side ends of at least one of the other magnetic film.

7. An inductive element according to claim 1, wherein, a width of each magnetic film increases as a distance of each magnetic film increases from the coil layer such that, of any two magnetic films from among those forming said magnetic layer, both side ends of the magnetic film more distant from said coil layer extend sideways from both side ends of a magnetic film closer to the coil layer.

8. An inductive element according to claim 1, wherein one of a slit and a notched portion is formed in at least one magnetic film excluding the magnetic film most distant from said coil layer from among the magnetic films forming said magnetic layer.

9. An inductive element comprising a coil layer and a magnetic layer covering said coil layer via an insulating layer; said magnetic layer having at least two superposed magnetic films, including a combination of magnetic films in which magnetic permeability of a magnetic material forming the magnetic film close to said coil layer is smaller than magnetic permeability of a magnetic material forming the magnetic film more distant from said coil layer, for any two magnetic films forming said magnetic layer.

10. An inductive element according to claim 9, wherein said magnetic layer has at least three magnetic films, and magnetic permeability of a magnetic material forming the magnetic film closest to said coil layer is smaller than magnetic permeability of a magnetic material forming the other magnetic films.

11. An inductive element according to claim 9, wherein said magnetic layer has at least three superposed magnetic films, and magnetic permeability of a magnetic material forming the magnetic film most distant from said coil layer is larger than magnetic permeability of a magnetic material forming the other magnetic films.

12. An inductive element according to claim 9, wherein permeability of the magnetic material forming said magnetic films sequentially increases as the magnetic films increase in distance from said coil layer.

13. An inductive element according to claim 9, wherein the magnetic film closest to the coil layer from among the magnetic films forming said magnetic layer has both side ends located closer to a center of the coil layer than both side ends of at least one of the other magnetic films.

14. An inductive element according to claim 9, wherein the magnetic film most distant from the coil layer from among the magnetic films forming said magnetic layer has both side ends extending sideways further than both side ends of at least one of the other magnetic films.

15. An inductive element according to claim 9, wherein, for any two magnetic films from among the magnetic films forming said magnetic layer, a magnetic film more distant from said coil layer has a larger width than a magnetic film closer to said coil layer such that both side ends of the magnetic film more distant from said coil layer extend further sideways than both side ends of than magnetic film closer to said coil layer.

16. An inductive element according to claim 9, wherein, from among the magnetic films forming said magnetic layer, a slit of a notched portion is formed in at least one magnetic film except for the magnetic film most distant from said coil layer.

* * * * *